United States Patent
Zhang et al.

[11] Patent Number: 5,999,043
[45] Date of Patent: Dec. 7, 1999

[54] ON-CHIP HIGH RESISTANCE DEVICE FOR PASSIVE LOW PASS FILTERS WITH PROGRAMMABLE POLES

[75] Inventors: Zhengwei Zhang, Richardson; James R. Hellums, Plano, both of Tex.

[73] Assignee: Texas Instruments Incorporated, Dallas, Tex.

[21] Appl. No.: 08/993,876

[22] Filed: Dec. 18, 1997

Related U.S. Application Data

[60] Provisional application No. 60/033,478, Dec. 19, 1996.

[51] Int. Cl.[6] .................................................. H03K 5/00
[52] U.S. Cl. ........................ 327/558; 327/552; 327/537; 327/308; 333/172
[58] Field of Search ................................... 327/552, 558, 327/311, 308, 344, 537; 333/172, 174; 330/305

[56] References Cited

U.S. PATENT DOCUMENTS 4,851,719  7/1989  Hitomi ..................................... 327/553

*Primary Examiner*—Dinh T. Le
*Attorney, Agent, or Firm*—Alan K. Stewart; Wade James Brady, III; Richard L. Donaldson

[57] ABSTRACT

A resistive element including a P-channel MOS device (101, 401, 402, 608a–608c) having a first and second current carrying electrodes, and a gate. The first current carrying electrode forms a first impedance terminal and the second current carrying electrode forms a second impedance terminal. A bias circuit (103, 104, 105, 106) coupled to the first current carrying electrode and gate of the P-channel MOS device (101, 401, 402, 608a–608c). The bias circuit (103, 104, 105, 106) generates a voltage less than the threshold voltage of the P-channel MOS device (101, 401, 402, 608a–608c).

5 Claims, 3 Drawing Sheets

ON-CHIP HIGH RESISTANCE DEVICE FOR PASSIVE LOW PASS FILTERS WITH PROGRAMMABLE POLES

This application claims priority under 35 USC §119(e)(1) of provisional application No. 60/033,478 filed Dec. 19, 1996.

BACKGROUND OF THE INVENTION

1. Field of the Invention

The present invention relates, in general, to monolithic devices for integrated circuits and, more particularly, to a monolithic high impedance device with programmable poles for use in passive low pass filters.

2. Relevant Background

Integrated circuits comprise a number of passive and active devices formed monolithically on a single integrated chip. Usually if more devices can be formed on a single chip the overall system cost for the electronic circuit using the chip is reduced. While great strides have been made in reducing the size of active devices such as transistors, passive devices such as resistors, have been somewhat more difficult to shrink. In particular, resistors are difficult to fabricate because high resistivity materials tend to be non-uniform leading to unpredictable resistor values.

Large value resistors are formed by long serpentine strings of resistive material. For resistance values larger than 10 megaohms, most manufacturers rely on off-chip, discrete resistors. The use of discrete components complicates circuit design, adds parasitics due to the interconnections between the integrated circuit and the discrete components, increases cost of the overall system and reduces reliability because of the additional connections. Moreover, valuable input-output leads to access the integrated circuit are dedicated for connections to the external passive components, limiting functionality of the integrated circuit and increasing cost of the packaging.

Passive low pass filters are widely used in voltage reference systems (e.g., power supplies, DC-DC converters, AC-DC converters, and the like). To effectively remove low frequency noise such as 1/f noise, a pole located at lower than 10 Hertz (Hz) is required. A "pole" is a point in the complex frequency plane where the magnitude of a given network function goes to infinity. Such a low frequency pole is usually achieved by a low pass filter using a resistor-capacitor combination. At least one and in some designs both the resistor and capacitor are implemented by off-chip components. These low pass filters provide a large time constant determined by the product of the resistance and capacitance used in the filter. On-chip resistors are usually limited to values of less than 10 megaohms because of the large area taken up by large value resistors.

What is needed is a low cost volume efficient structure and method for monolithically integrating large value resistors onto integrated circuits.

SUMMARY OF THE INVENTION

The present invention involves a resistive element including a P-channel MOS device having a first and second current carrying electrodes, and a gate. The first current carrying electrode forms a first impedance terminal and the second current carrying electrode forms a second impedance terminal. A bias circuit is coupled to the first current carrying electrode and gate of the P-channel MOS device. The bias circuit generates a voltage less than the threshold voltage of the P-channel MOS device.

Preferably, the P-channel MOS device is a compound transistor comprising a first P-channel MOSFET having gate, drain, and source electrodes, and a second P-channel MOS transistor having gate, drain, and source electrodes. The source electrodes of the first and second P-channel MOS transistors are shorted together and the gate electrodes of the first and second P-channel MOS transistors are shorted together. The drain of the first P-channel MOS transistor forms the first impedance terminal and the drain of the second P-channel MOS transistor forms the second impedance terminal.

The present invention is desirably implemented as one stage in a low pass filter by coupling a capacitor from the output terminal to ground. Due to the large resistance implemented by the resistive element in accordance with the present invention, the capacitor can be quite small.

DETAILED DESCRIPTION OF THE PREFERRED EMBODIMENTS

In each of the preferred embodiments, a high impedance element is implemented using a metal oxide semiconductor field effect transistor (MOSFET) biased to operate in its sub-threshold region. The circuits in accordance with the present invention are useful for single chip integrated solutions of large RC time constants. Applications such as low frequency noise filtering and long duration one-shot pulse generation will benefit from the circuits and devices in accordance with the preferred embodiments. Impedances in the range of 1 megaohm to 10 gigaohm have been fabricated in accordance with the present invention.

In each embodiment, the high resistance element is biased by a current mirror type constant current circuit to ensure accurate biasing. Each embodiment includes variations to the particular interconnections and biasing network to adapt to the needs of a particular application. Typical applications include filtering an on-chip reference voltage supplied to a high input impedance amplifier or comparator, low current power supply filtering. Any application that uses a conventional fixed-pole low pass filter with an external passive component may find the low pass filter in accordance with the present invention useful.

Figure 1:
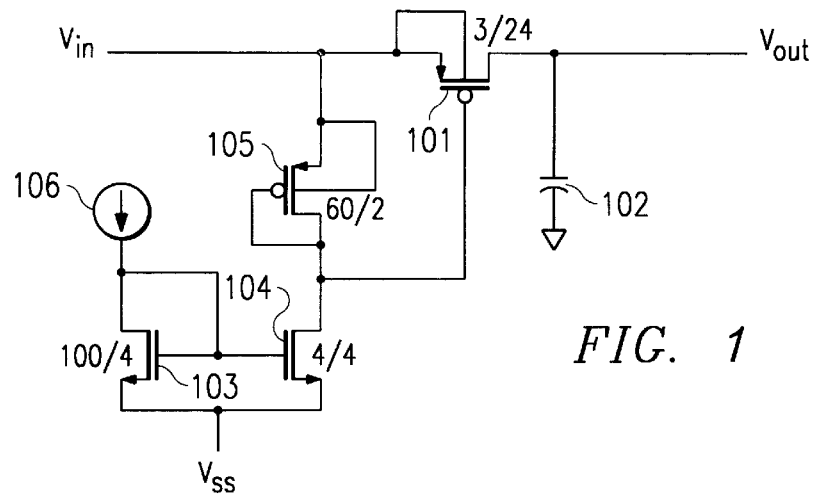
FIG. 1 shows in schematic form a first embodiment implementation of a high resistance low pass filter in accordance with the present invention.

Referring to FIG. 1, P-channel transistor 101 is coupled in line with an in input voltage signal $V_{in}$. $V_{in}$ is an unfiltered input voltage where $V_{out}$ is the filtered output. Capacitor 102 is, for example, a 10 picofarad (pf) capacitor formed monolithically with the other components in the integrated circuit. Device 101 and capacitor 102 essentially form an RC filter having a large time constant due to the large value of resistance given by device 101.

Transistors 103 and 104 form a conventional current mirror driven by current source 106 to a current of, for example, 0.16 microamps. The current mirror formed by transistors 103 and 104 may be coupled to the negative power supply ($V_{SS}$) or coupled to ground in an alternative embodiment depending on the needs of the particular application.

Transistor 105 is a P-channel transistor having its gate terminal shorted to drain and with its gate coupled to current mirror transistor 104. Transistor 105 serves to hold the gate of transistor 101 at the precision sub-threshold voltage determined by the current mirror and the relative geometries of transistor 105 and transistor 101. Transistor 105 and 101 are essentially coupled as a current mirror so that transistor 101 will be operating in triode or linear with a sub-threshold voltage applied. This allows transistor 101 to function as a very high impedance device. This allows transistor 101 to function as a very high impedance linear device.

While it is commonly understood that the on resistance of transistor 101 will vary with the drain-source voltage under constant gate bias, several features of the present invention enable substantially constant resistance. First, when used in the preferred applications such as a low pass filter, only small positive and negative drain-source voltages are developed at steady state. Small drain-source voltage excursions keep transistor 101 operating in a linear or triode region near zero voltage and zero current.

In terms of the transistor channel, the sub-threshold bias is insufficient to strongly invert the channel. As used herein, "sub-threshold" means a gate to source voltage sufficient to invert the channel of transistor 101 while preventing the channel of transistor 101 from reaching strong inversion. The usual meaning of strong inversion is that the surface of the channel of transistor 101 is as strongly p-type as the substrate is n-type (for a P-channel implementation). In other words, $E_i$ (the intrinsic energy band level of the channel of transistor 101) lies as far below the Fermi level $E_F$ at the surface as it is above $E_F$ far from the surface. This condition occurs when the surface potential is twice the Fermi potential (i.e., $\phi_s=2\phi_F$).

Bias device 105 provides a voltage on the gate of transistor 101 that automatically varies or tracks changes in $V_{in}$ to ensure that transistor 101 remains in the sub-threshold region. If, for example, the threshold voltage of transistor 101 decreases due to increased temperature, the threshold voltage of transistor 105 will decrease substantially the same amount. Hence, the gate-to-source voltage across transistor 101 will remain at the voltage set by the current flowing through transistor 104. In general anything that tends to change the sub-threshold bias point of transistor 101 will similarly effect bias transistor 105 which will tend to compensate. Hence, the resistive device in accordance with the present invention is self compensating.

In FIG. 1, the back gate of transistor 101 is coupled to the source of transistor 101. This places the body-drain capacitor ($C_{bd}$) across $V_{in}$ to $V_{out}$ and limits maximum signal attenuation to about 60 dB. Also, the high resistance implemented by transistor 101 results in significant charging time for capacitor 102 even if it is a relatively small value. When capacitor 102 is completely discharged, the charge time can be several seconds which may be undesirable in some applications.

Figure 2:
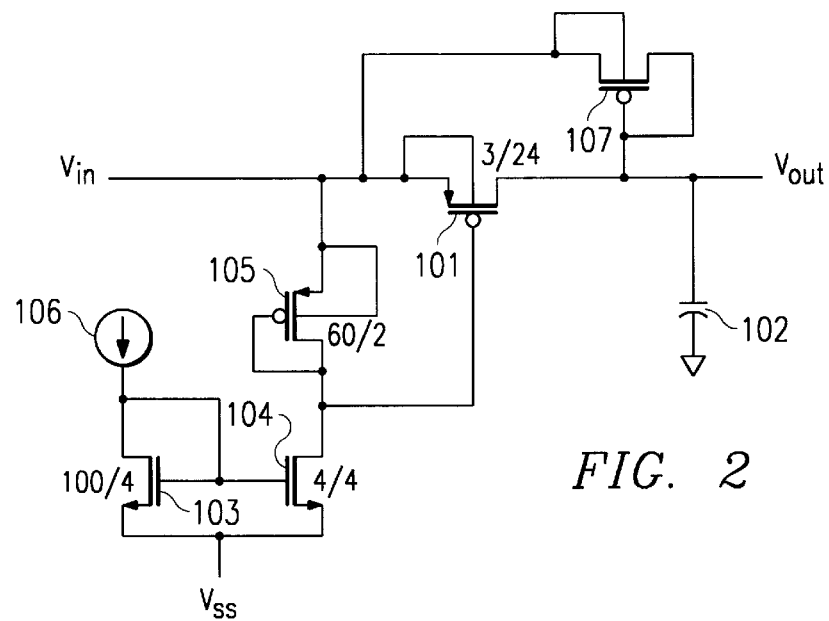
FIG. 2 illustrates a second embodiment low pass filter in accordance with the present invention.

FIG. 2 illustrates a second embodiment including a transistor 107 used to reduce the charge up time. Transistor 107 is a P-channel transistor having gate and drain shorted with the back gate coupled to the source. The source and back gate are also coupled to the $V_{in}$ signal line. Transistor 107 serves to rapidly charge capacitor 102 at startup. In a steady state condition, the circuit shown in FIG. 2 is equivalent to the circuit of FIG. 1 for purpose of removing low frequency noise. One penalty of using transistor 107 is that the gate-source capacitance of transistor 107 shunts the input and output nodes, therefore, the maximum attenuation is even more limited than the embodiment shown in FIG. 1.

Figure 3:
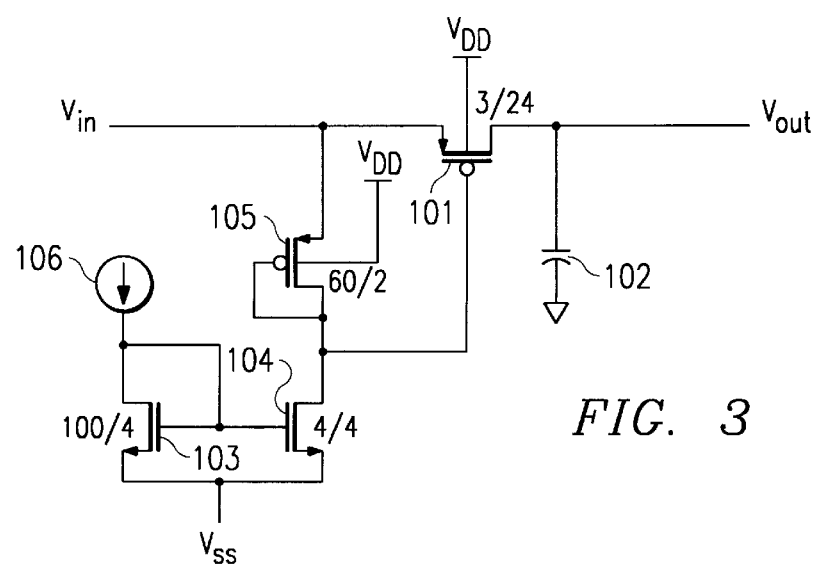
FIG. 3 shows in schematic form a third embodiment low pass filter in accordance with the present invention.

Attenuation is maximized by coupling the N well contacts (i.e., the back gates) to a positive power supply as shown in FIG. 3. Although the arrangement shown in FIG. 3 maximizes attenuation from the input node to the output node, noise can be now coupled from the $V_{DD}$ power supply to the output node. Hence, the arrangement shown in FIG. 3 is only appropriate when extremely high quality low noise $V_{DD}$ power supply is available.

Figure 4:
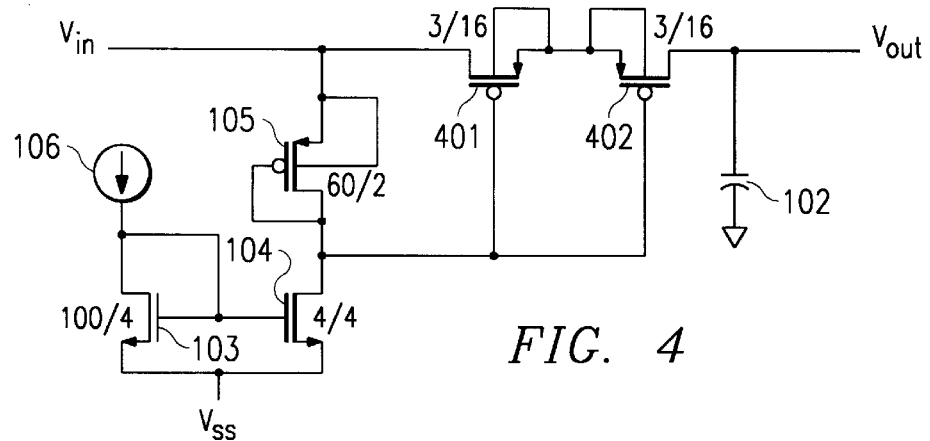
FIG. 4 illustrates in schematic form a fourth embodiment in accordance with the present invention.
Figure 5:
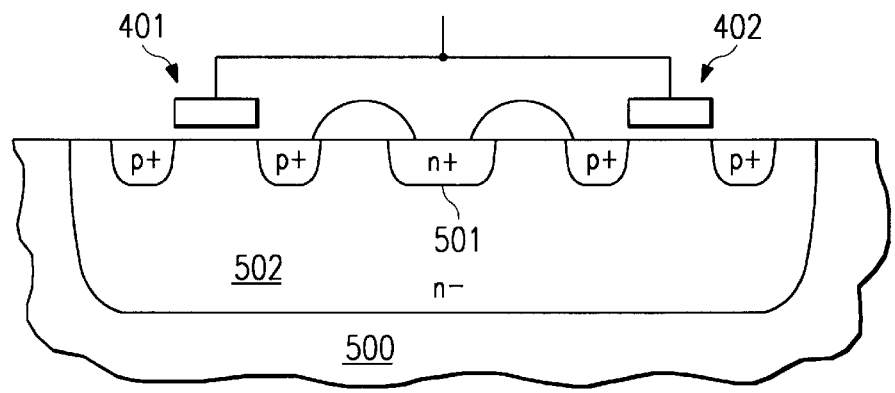
FIG. 5 shows in cross-section a semiconductor structure implementing the schematic shown in FIG. 4.

In an improved embodiment shown in FIG. 4, transistor 101 is replaced with a compound device comprising two P-channel transistors 401 and 402 coupled in series. Transistors 401 and 402 are formed in a single well 502 in a substrate 500 as illustrated in FIG. 5. The N well is coupled by a low resistivity contact region 501 to the sources of each of transistors 401 and 402. Computer simulations indicate that the structure shown in FIG. 4 provides an additional 12 dB attenuation as compared to the circuit shown in FIG. 1. The compound transistor formed by transistors 401 and 402 eliminates the feed forward capacitance $C_{bd}$.

FIG. 5 illustrates the structure of the compound transistor shown in FIG. 4. The $P^+$ regions form drain/source regions for transistors 401 and 402. Transistors 401 and 402 are formed in a common $N^-$ well 502 contacted by $N^+$ region 501 (shown in FIG. 5). The gate terminals of transistors 401 and 402 are coupled by conventional patterned metallization. Also, $P^+$ source regions of transistors 401 and 402 are coupled by patterned metallization to $N^+$ region 501 as shown in FIG. 5.

Figure 6:
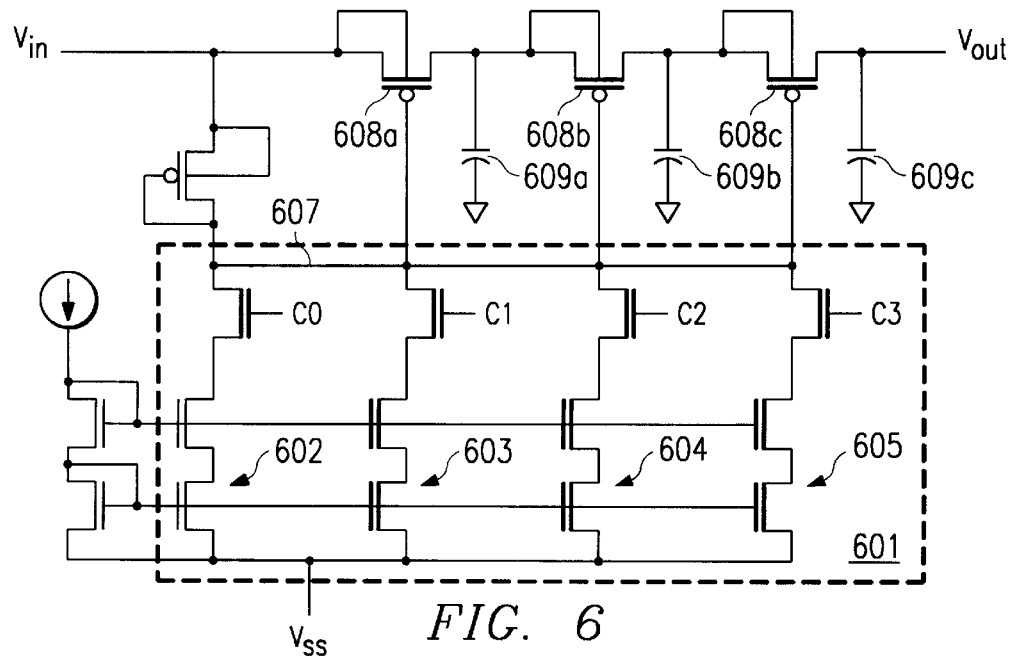
FIG. 6 shows in schematic form a fifth embodiment in accordance with the present invention.

A particular advantage of the high impedance structure in accordance with the present invention is that the pole of each of the above circuits can be easily programmed because the resistance is controlled by a bias current. FIG. 6 illustrates an example circuit where the current mirror is replaced by a current mode four-bit digital-to-analog converter (DAC) 601. Transistor 602 is designed to have two times the current of transistor 603. Likewise transistor 604 is designed to have half the current of 603 and transistor 605 is designed to have half the current of transistor 604. Hence, when $C_3$ is activated minimal current will flow setting node 607 at a first voltage. Appropriate activation of $C_0$, $C_1$, $C_2$, and $C_3$ will provide a current ranging from the minimal current to the maximal current possible when all four control bits are asserted. The digital-to-analog converter (DAC) 601 shown in FIG. 6 is an example only, and other current control techniques are known that will work equally well in accordance with the teachings of the present invention.

FIG. 6 also illustrates a multistage filter coupled to enable a third order filter. Any number of filter stages can be used and coupled in series as shown in FIG. 6. Although the particular example of FIG. 6 comprises three stages, it should be understood that two stages can be used to realize a second order filter. In general N stages are used to realize an $N^{th}$ order filter. Each stage includes a programmable impedance element such as transistors 608a, 608b, and 608c. Each stage also includes a capacitor such as capacitors 609a, 609b, and 609c. One advantage of the programmable bias circuit shown in FIG. 6 is that the pole for each stage can be programmed through adjustment of the resistance provided by impedance elements 608a–608c. The low pass filter in accordance with the present invention is easily adapted to cascading multiple stages because of the programmable pole enabled by DAC 601. Alternatively, each gate of transistor 608a, 608b, and 608c could be controlled by a separate digital analog converter (or equivalent programmable voltage or current source) to allow precision tuning of the low pass filter network. The high order low pass filter of FIG. 6 is useful in, for example, an anti-aliasing filter and a smoothing filter in a sampled data system.

Figure 7:
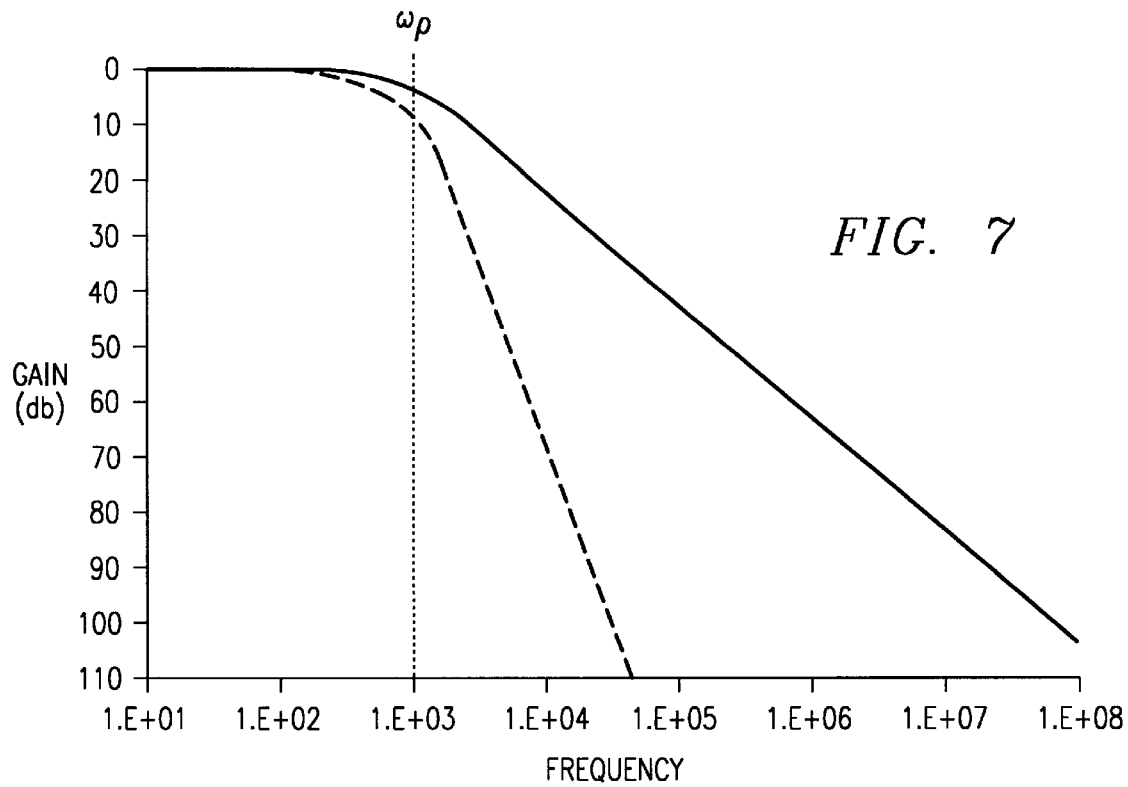
FIG. 7 shows an AC response curve of a first and a third order filter in accordance with the present invention biased to a first pole location.
Figure 8:
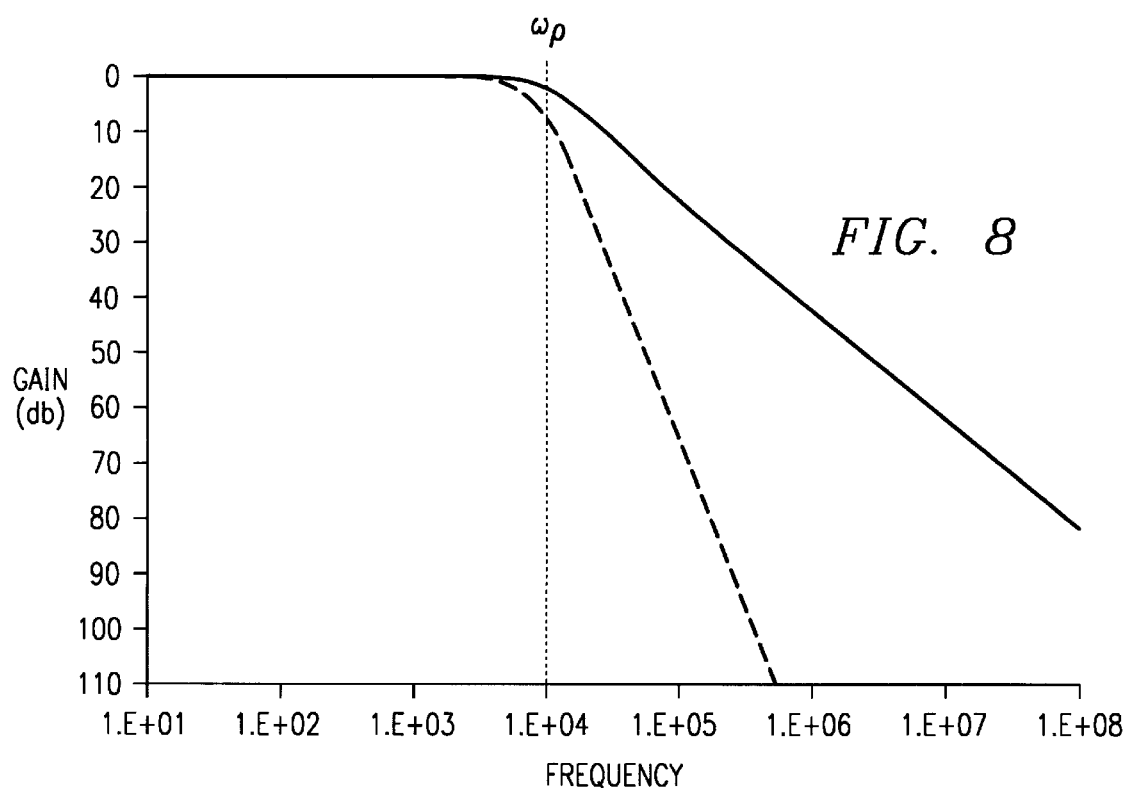
FIG. 8 shows an AC response curve of the first and third order filters in accordance with the present invention biased to a second pole location.

FIG. 7 shows a comparison of a first order filter such as the structure shown in FIG. 4 and a third order filter such as the structure shown in FIG. 6. The AC response decreases predictably with frequency at the breakover point indicated by $\omega_p$ is selected by the bias of the programmable impedance device in accordance with the present invention. In FIG. 7, the pole is located at approximately $1 \times 10^3$ Hz. In contrast, FIG. 8 illustrates the effect of changing bias on the programmable impedance device. In FIG. 8 the bias of both the first order and third order filters are selected to locate a pole at $1 \times 10^4$ Hz which is accomplished by decreasing the resistance An improved low pass filter using a high impedance monolithically integrated device is provided. By using an on-chip high impedance device, the need for external components is eliminated. Because the device is programmable, the pole of the filter can be precision aligned to meet the needs of a particular application. Although the present invention has been described in terms of specific circuitry, including implementation in P-channel MOS transistors, it should be understood that other modifications and equivalent variations are possible and are within the abilities of the ordinarily skilled circuit designer.

Accordingly, these and other modifications are considered equivalent to the specific embodiments disclosed and within the scope and spirit of the present invention.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:
1. An impedance element comprising:

a P-channel MOS device having a first and second current carrying electrodes, and a gate, wherein the first current carrying electrode forms a first impedance terminal and the second current carrying electrode forms a second impedance terminal, the first current carrying electrode is coupled to an input node and the second current carrying electrode is coupled to an output node;

an MOS transistor having a source electrode coupled to the first current carrying electrode and a gate and drain electrode coupled to the gate electrode of the P-channel MOS device;

a current source coupled to drive a constant drain-source current through the MOS transistor, wherein the MOS transistor and the current source bias the P-channel MOS device in a sub-threshold region; and a capacitor coupled between the output node and a ground node.

2. The impedance element of claim 1 wherein the P-channel MOS device includes a back gate that is coupled to a positive power supply voltage.

3. The impedance element of claim 1 wherein the P-channel MOS device includes a back gate that is coupled to the first current carrying electrode.

4. The impedance element of claim 1 further comprising a P-channel transistor having a drain, a source and a gate wherein the drain of the P-channel transistor is coupled to the second impedance terminal, the source of the of the P-channel transistor is coupled to the first impedance terminal and the gate is coupled to the second impedance terminal.

5. The impedance element of claim 1 wherein the P-channel MOS device is a compound transistor comprising a first P-channel MOSFET having gate, drain, and source electrodes, and a second P-channel MOS transistor having gate, drain, and source electrodes, wherein the source electrodes of the first and second P-channel MOS transistors are coupled together, the gate electrodes of the first and second P-channel MOS transistors are coupled together, the drain of the first P-channel MOS transistor forms the first impedance terminal and the drain of the second P-channel MOS transistor forms the second impedance terminal.

\* \* \* \* \*